United States Patent [19]

Mroczkowski et al.

[11] Patent Number: 5,417,578
[45] Date of Patent: May 23, 1995

[54] PRINTED WIRING BOARDS HAVING LOW SIGNAL-TO-GROUND RATIOS

[75] Inventors: Robert S. Mroczkowski, Lititz; Richard E. Rothenberger, Harrisburg, both of Pa.

[73] Assignee: The Whitaker Corporation, Wilmington, Del.

[21] Appl. No.: 996,557

[22] Filed: Dec. 24, 1992

[51] Int. Cl.⁶ .............................. H01R 9/09
[52] U.S. Cl. ................................ 439/101
[58] Field of Search ............. 439/101, 108, 109, 78, 439/70, 66, 63, 581, 607, 608; 361/777–780, 794; 174/262, 267

[56] References Cited

U.S. PATENT DOCUMENTS

| | | | |
|---|---|---|---|
| 3,325,766 | 6/1967 | Kolb | 439/78 |
| 3,461,552 | 8/1969 | Wolf | 361/777 |
| 4,129,349 | 12/1978 | von Roesgen | 439/49 |
| 4,361,634 | 11/1982 | Miller | 430/5 |
| 4,451,107 | 5/1984 | Dola et al. | 439/65 |
| 4,511,197 | 4/1985 | Grabbe et al. | 439/71 |
| 4,513,353 | 4/1985 | Bakermans et al. | 361/399 |
| 4,524,240 | 6/1985 | Stock et al. | 361/777 |
| 4,583,150 | 4/1986 | Boonstra | 361/777 |
| 4,616,292 | 10/1986 | Senoku et al. | 361/794 |
| 4,647,124 | 3/1987 | Kandybowski | 439/515 |
| 4,699,593 | 10/1987 | Grabbe et al. | 439/71 |
| 4,762,500 | 8/1988 | Dola et al. | 439/79 |
| 4,900,258 | 2/1990 | Hnatuck et al. | 439/63 |
| 4,927,369 | 5/1990 | Grabbe et al. | 439/66 |
| 5,079,671 | 1/1992 | Garrett et al. | 439/108 |
| 5,190,473 | 3/1993 | Mroczkowski et al. | 439/580 |
| 5,308,252 | 5/1994 | Mroczkowski | 439/66 |
| 5,310,352 | 5/1994 | Mroczkowski | 439/76 |

OTHER PUBLICATIONS

Rothenberger et al., High-Density Zero Insertion Force Microcoaxial Cable Interconnection Technology, pp. 1–5.

*Primary Examiner*—Neil Abrams
*Attorney, Agent, or Firm*—Anton P. Ness

[57] ABSTRACT

Printed wiring boards having low signal-to-ground ratios. Printed wiring boards described herein comprise a first and second sides, and a plurality of signal plated-through-holes extending from the first side to the second side of the printed wiring board. There is also provided a plurality of ground plated-through-holes extending from the first side to the second side of the printed wiring board, and a ground plane plated on a first side and in electrical communication with selected ones of the plurality of ground plated-through-holes and defining a signal-to-ground ratio for the printed wiring boards. Printed wiring boards described herein with plating patterns in accordance with the invention are versatile and ensure high electrical integrity by modifying the signal-to-ground ratio of the printed wiring boards and enabling higher density of contact pads.

31 Claims, 7 Drawing Sheets

PRINTED WIRING BOARDS HAVING LOW SIGNAL-TO-GROUND RATIOS

FIELD OF THE INVENTION

This invention relates generally to printed wiring boards. More specifically, this invention relates to printed wiring boards having low signal-to-ground ratios.

BACKGROUND OF THE INVENTION

Connector systems for interfacing diagnostic or analytical devices with an outside source of data are known. Generally, a connector system comprises at least two electrical interfaces, one on each of two sides of a connector module. On the first side of the connector module, the connector is interfaced with an outside source which generates a signal that is indicative of the state of a system under observation or otherwise activated. On the second side of the connector module, a second interface is provided to bus the signals from the outside source to an analytical or diagnostic device for analysis and data processing. Examples of such devices are ultrasound equipment, radar equipment, computer equipment, and other electronic devices which have an input interface. Connectors have been designed for use with all such devices and others.

In more sophisticated systems which implement high speed data links from the outside source to the device, the connector interfaces can become very complex. To achieve high integrity data communications between the outside source of data and the device, prior connectors have been designed to accommodate high density contacts so that increased data flow through the connector at high frequencies and at high speeds can be achieved. Examples of such connectors and connector systems are found in U.S. Pat. No. 4,699,593, Grabbe et al., and U.S. Pat. No. 4,927,369, Grabbe et al., the teachings of both being specifically incorporated herein by reference.

In the connectors such as those disclosed in the Grabbe et al. patents, the individual electrical interface contact members in the connector modules are usually on 100 mil centerlines which causes the size of the connector modules to increase dramatically as the contact count increases. Furthermore, the actuation forces necessary to achieve the interface between the second side of the connector and the device are greatly increased as the number of pins increases, thereby increasing the possibilities of misalignment of the connector and failure of the data interface. Additionally, many of these prior connectors are utilized in a manner requiring only a relatively small number of mating/unmating cycles.

Connectors to accommodate high contact densities for use in high speed data devices may comprise a plurality of modular connectors with electrical interface contacts as described above and a printed wiring board to which the modular connectors are plugged. The printed wiring boards also contain a plurality of circuits that are adapted to communicate the data from the outside source to the device which processes the data. The contact surfaces or pads on the printed wiring boards are typically interfaced with a substrate in the device which is further adapted to receive the communicated data from the outside source. This substrate may be yet another printed wiring board, printed circuit board, or other electrical receiving device which can interface with the contact pads on the printed wiring board in the connector.

When a high density of contacts is required, an interposer is also oftentimes provided to establish a connection medium between the printed wiring board and the substrate. An "interposer" is typically a land grid array which effectuates and/or facilitates contact between the printed wiring board and the substrate. Such interposers are especially useful when the closely spaced contact members on a connector prevent a direct interface to the printed wiring board. The interposer thus provides a separate set of contact elements which must be firmly secured against both the contact members of the connector and a printed wiring board in the device.

Connector modules for use with printed wiring boards in connector systems may be devised which utilize individual ones of the contact members or pins to provide a ground to the system. However, the use of individual pins physically limits the "signal-to-ground" ratio capabilities of the connectors. The "signal-to-ground" ratio is a parameter developed to quantify the efficiency of an electrical device, such as a printed wiring board, in an electrical system. In general, the lower the signal-to-ground ratio, the better the performance of the electrical component since the component will contain a larger number of ground interfaces with respect to the number of signal interfaces, thereby providing a clean signal to the system with good electrical integrity. The signal-to-ground ratio is determined by dividing the number of signal contacts in the component by the number of ground contacts or connections found in the component. For example, a coaxial cable which is terminated to a coaxial connector has a 1:1 signal-to-ground ratio since there is one ground conductor, usually an outer sheath, to one signal conductor, usually a center conductor wire. A similar problem has existed in card connectors or cable assemblies which have pins that are adapted to connect cables to computer boards. By placing a ground plane in between rows of pins in these connectors, the signal-to-ground ratio of the connector is desirably decreased.

Printed wiring boards in connector systems that utilize a plurality of such coaxial or microcoaxial cables, have a like plurality of signal contact pads associated with respective signal conductors, and conventionally a like plurality of ground contact pads which define a 1:1 signal-to-ground ratio for the board. In typical connector systems having a plurality of coaxial lines, the grounds of the individual coaxes are commoned and connected to a small number of pins for transmission through the connector module. This has the net effect of increasing the signal-to-ground ratio from the 1:1 of a coaxial cable to some higher number, typically 5:1 or larger.

This higher signal-to-ground ratio is a consequence of the desire in the art to minimize the pin count and associated assembly time required to put a modular connector together. Minimization of pin count is achieved since termination of the connector module generally involves gang soldering of the coax ground elements to a common circuit connected electrically to a single post in the connector module which ultimately connects to a ground contact of a mating connector in an electrical apparatus. By reducing the number of soldering operations to the post to a single common ground gang soldering operation, a great amount of manufacturing time is saved.

Thus a tension exists between (1) the need to miniaturize and modularize multicable connector modules tending to undesirably increase the signal-to-ground ratio, and (2) the desire to reduce the signal-to-ground ratio to maintain high electrical signal integrity for the connector. This tension is acutely felt in the design of high pin count and/or high density microcoaxial connectors for use as transmission media in high speed electronic applications. Particularly, microcoaxial interconnection schemes must maintain acceptable levels of signal integrity, particularly with respect to crosstalk, shielding, and controlled impedance. To maintain these high performance levels, the connectors must minimize effects of the impedance and shielding of the coaxial cables through the connector and across the separable interface. There has not been a solution heretofore in the art to address this tension.

SUMMARY OF THE INVENTION

Accordingly, the inventors of the subject matter disclosed and claimed herein have recognized that it would be desirable to design a connector printed wiring board which minimizes the signal-to-ground ratio of the board. Furthermore, these printed wiring boards should be useful in connectors that interface data signals from an outside source to a device that will utilize the data signals. A low signal-to-ground ratio should be achievable in customized connector systems which will meet the specialized individual requirements of the modular connector system which comprises part of the system having a high density pin count. Such results have not heretofore been achieved in the art.

In preferred embodiments, printed wiring boards comprise a first side, a plurality of signal plated-through-holes extending from the first side to a second side of the printed wiring board, a plurality of ground plated-through-holes extending from the first side to the second side, and a ground plane plated on the first side and in electrical communication with selected ones of the plurality of ground plated-through-holes and defining a signal-to-ground ratio for the printed wiring boards.

In still further preferred embodiments, a connector having a separable interface is taught and claimed herein. The connector preferably comprises a connector module having a plurality of signal pins and a plurality of ground pins for bussing a signal from an outside source to a device that will utilize the signals. In a preferred aspect of the invention, the connector further comprises a printed wiring board having first and second sides and further comprising a first row of signal plated-through-holes interfaced with the plurality of signal pins, a row of ground plated-through-holes interfaced with the plurality of ground pins, and a plating surface on the first side of the printed wiring board which makes a plating pattern thereon between the row of ground plated-through-holes, thereby defining a signal-to-ground ratio for the printed wiring board of between about 1:1 and about 5:1.

Methods of establishing a signal-to-ground ratio for a printed wiring board having at least one row of signal plated-through-holes are also provided in accordance with the present invention. The methods preferably comprise the steps of providing a plurality of ground plated-through-holes to the printed wiring board interfaced through a first side of the printed wiring board onto a second side of the printed wiring board, plating a ground plane on the first side of the printed wiring board with a substantially conductive material, and interconnecting the plated ground plane to selected ones of the ground plated-through-holes to establish a signal-to-ground ratio for the printed wiring board of between about 1:1 and about 5:1.

The printed wiring boards in connectors provided in accordance witch the present invention modify the signal-to-ground ratios of these connectors to enable higher density arrays of contact pads and/or plated-through-holes for PWB "real estate" economy, while ensuring high electrical communication integrity for the connectors and printed wiring boards. Furthermore, printed wiring boards having plating patterns in accordance with the present invention are versatile and can be modified to produce a wide variety of configurations using common, well known plating processes. Thus, printed wiring boards in accordance with the present invention are versatile and can be customized depending upon the signal-to-ground ratio needs of the particular application. Printed wiring boards described and claimed herein are also economical to produce, and can be used in a variety of connectors that are designed to bus data from an external source to a device which will utilize the data.

Embodiments of the present invention will now be disclosed by way of example with reference to the accompanying drawings.

DETAILED DESCRIPTION OF PREFERRED EMBODIMENTS

Figure 1:
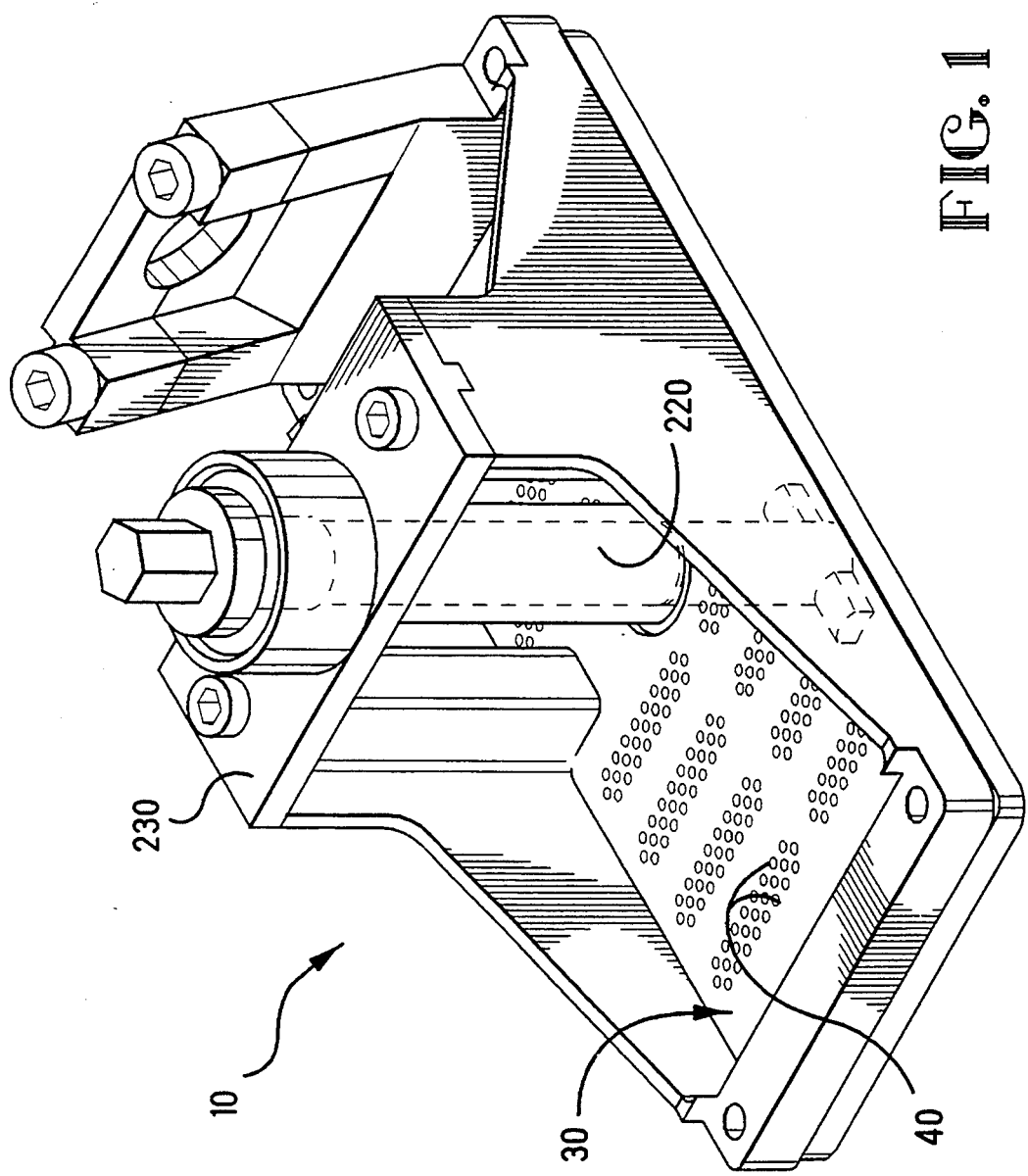
FIG. 1 is an isometric view of the support structure of a connector having a printed wiring board in accordance with the present invention.

Referring now to the drawings wherein like reference numerals refer to like elements, FIG. 1 shows a support structure of a connector in accordance with the present invention shown generally at 10 that is preferably adapted to electrically interface contacts to substrates. As used herein, the term "substrate" means an electrical component secured to a device which is adapted to receive electrical signals. In a preferred embodiment, connector 10 will also comprise a dielectric housing for mounting a printed wiring board shown generally at 30, as disclosed in U.S. Pat. No. 5,310,352, which is adapted to receive modular connectors that will communicate data from an outside source to the connector of the type disclosed in U.S. Pat. No 5,190,473.

Also as used herein, the term "printed wiring board" (PWB) means an electrical component that is adapted to bus data signals from an outside source to a device. Thus, the PWB 30 could be a printed circuit board (PCB) or any other electrical component which busses electrical signals from one location to another. For ease and convenience throughout, the reference to element 30 will be to a PWB. PWB 30 further preferably comprises a plurality of plated-through-holes 40 which mate with elements in the modular connector to interface the data signals which are bussed through the connector to the device that will utilize the data.

Although it is contemplated that the present connectors will be adaptable for use with a wide variety of devices, the device which utilizes connector 10 preferably comprises an analytical or diagnostic-type medical device such as ultrasound equipment, X-ray equipment, or other medical equipment which processes digital data signals from an outside source to perform the diagnostic function. The outside source could be, for example, an ultrasound sensor, or any other type of electrical component which transduces physical parameters to electrical signals which can then be processed by a computer or microprocessor contained in the device. The device is then able to yield useful information concerning the particular parameter under test. However, it will be recognized by those with skill in the art that any device which is adapted to process data will find connectors provided in accordance with the present invention useful.

Figure 2:
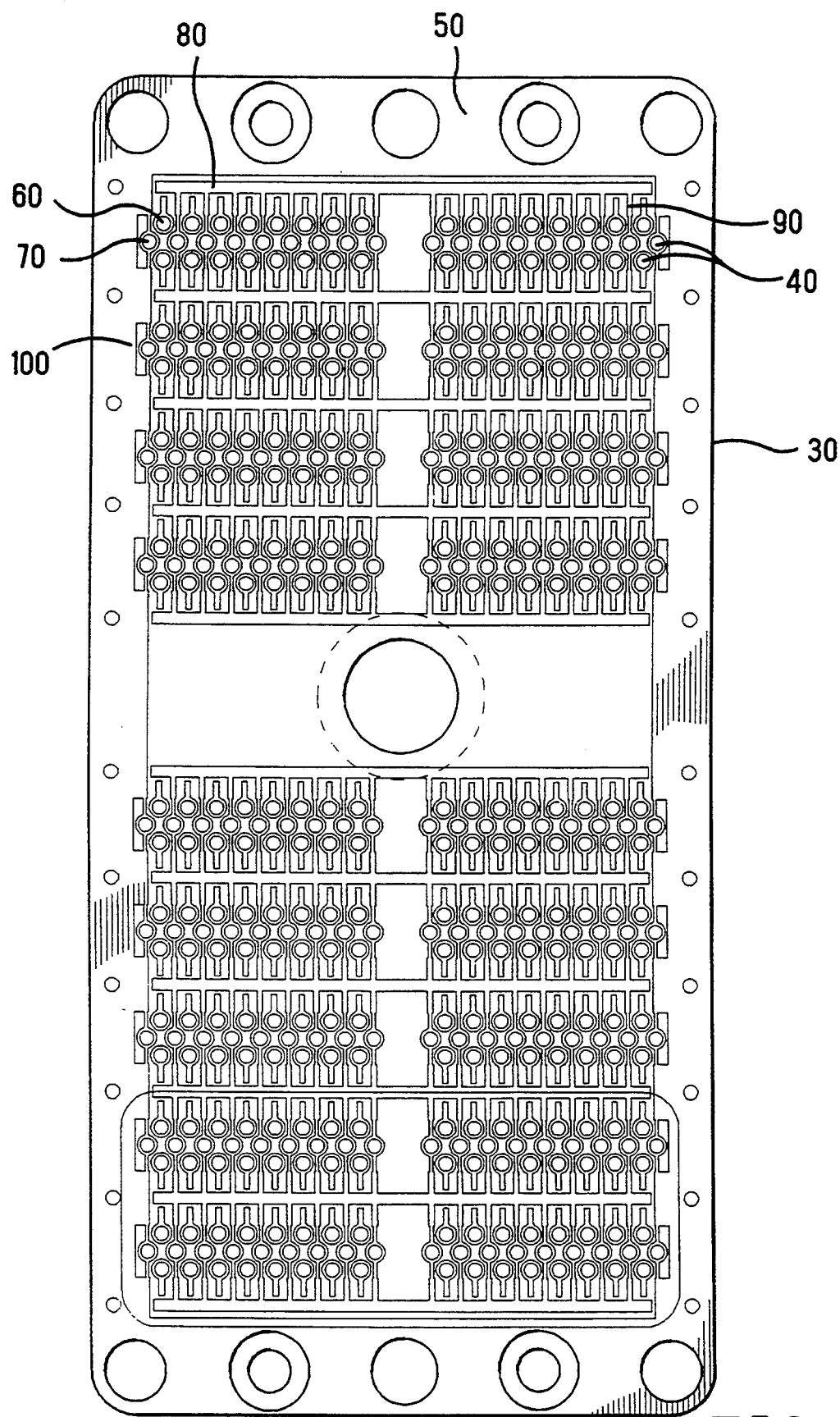
FIG. 2 is a plan view of a printed wiring board having a plating pattern which produces a signal-to-ground ratio for the printed wiring board of less than about 1:1.

Referring now to FIG. 2, in preferred embodiments PWB 30 comprises a first side shown generally at 50. The plurality of plated-through-holes 40 preferably further comprises a plurality of signal plated-through-holes 60 arranged in a first row, and a plurality of ground plated-through-holes 70 arranged in a row. The signal plated-through-holes 60 and ground plated-through-holes 70 all preferably extend from a first side 50 of PWB 30 to a second side of the PWB which is not shown in the plan view of FIG. 2.

In still further preferred embodiments, a ground plane made of a substantially conductive material shown at 80 is plated on the first side 50 of PWB 30 and is in electrical communication with selected ones of the plurality of ground plated-through-holes 70. Electrical communication is preferably established between the ground plane 80 and the ground plated-through-holes 70 through plated connections 90. The number of plated connections 90 to the ground plated-through-holes 70 define the signal-to-ground ratio for the PWB 30 and thus the connector 10. It will be recognized that a plurality of ground planes 80 can be plated on the first side 50 of PWB 30 and the number of ground planes 80 which are plated on PWB 30 will generally be governed by the desired number of modular connectors which are to be interfaced to the PWB 30.

Preferably the plurality of signal plated-through-holes 60 form at least a first row on the PWB 30 and are adapted to receive a set of signal electrical interface pins from a modular connector. The plurality of ground plated-through-holes 70 are adapted to receive a set of ground electrical interface pins from the modular connector.

In order to define the signal-to-ground ratio for the printed wiring board, a plating pattern is formed in accordance with the present invention by laying down a plating surface shown generally at 100 of a substantially conductive material on the first side 50 of PWB 30. The plating pattern 100 is preferably laid down on the first side 50 in between the various plated-through-holes thereon to form both the ground planes 80 and the interconnections 90 so that signals from an external source can be bussed through the modular connector having electrical interface pins therein and across the plated-through-holes to substrates in the device which will utilize the data signals. Since the plating pattern 100 is laid down between the various signal plated-through-holes 60 and ground plated-through-holes 70, the number of connections 90 from the ground plated-through-holes 70 to the ground plane 80 as compared to the number of signal plated-through-holes 60 will define the signal-to-ground ratio for PWB 30.

The plating surface 100 establishes an artwork pattern for PWB 30. Methods of producing artwork masters in the production of multilayer circuit boards are known. See, for example, U.S. Pat. No. 4,361,634, Miller, the teachings of which are specifically incorporated herein by reference. Standard methods of establishing PWB artwork can be employed in accordance with the present invention to obtain the PWB artwork which will define the signal-to-ground ratio for the PWB.

In accordance with the present invention, the plating surface 100 preferably comprises a thin gold/nickel/copper layer (for example) which lays down a planar circuit pattern that interconnects the ground plated-through-holes 70 to the ground plane or "pads" 80. More preferably, the pattern of contact pads on PWB 30 formed by the gold/nickel/copper plating surface 100 is arbitrary within limits and provides a versatile format for custom cable interconnection to meet varying pin count and signal-to-ground ratio requirements in a connector.

Figure 3:
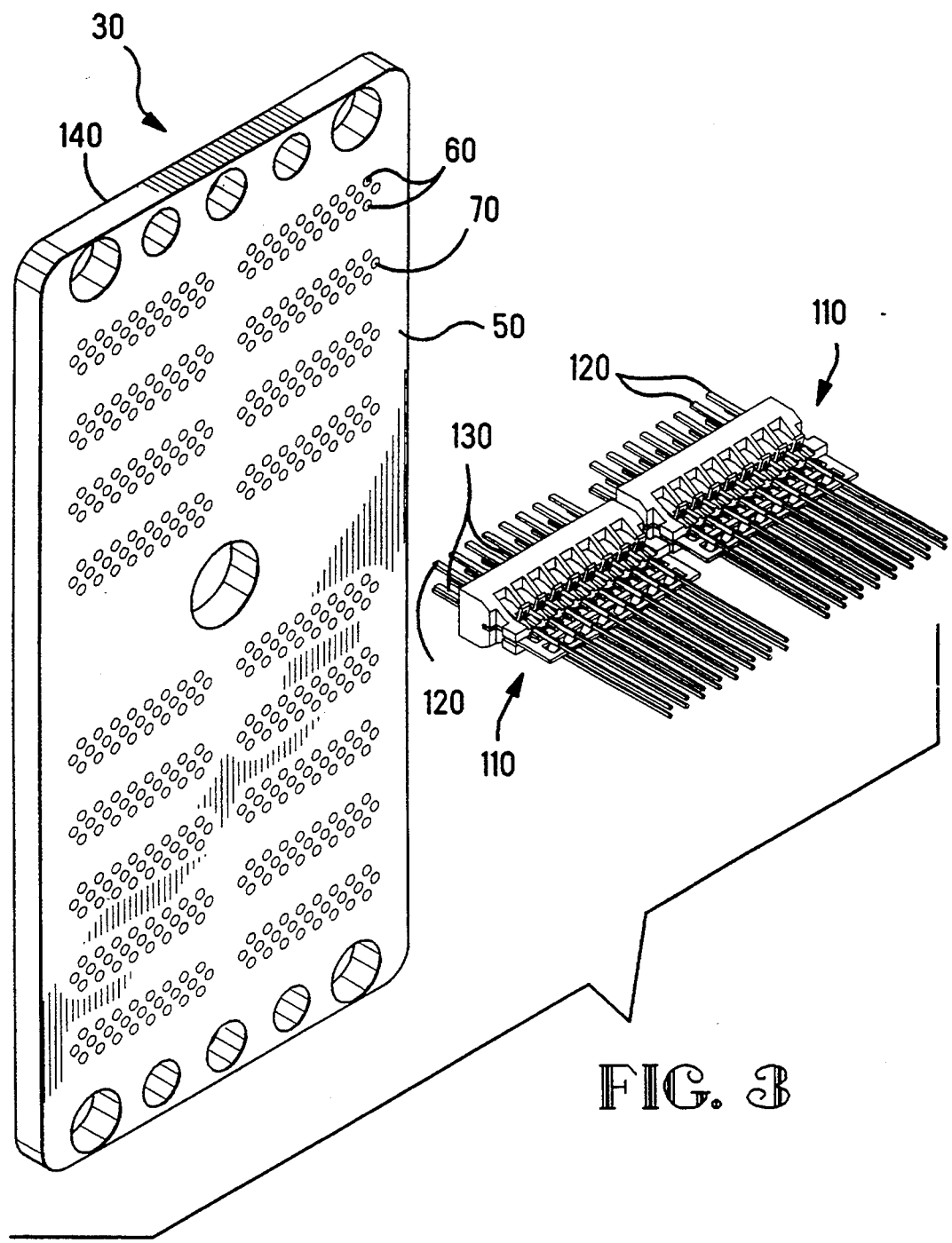
FIG. 3 illustrates the interfacing of a modular connector with a printed wiring board provided in accordance with the present invention.

Referring now to FIG. 3, a PWB 30 is further interfaced with a plurality of modular connectors shown generally at 110. Modular connectors 110 are preferably adapted to be used with microcoaxial cables and further comprise a plurality of signal pins shown at 120 formed in first and second rows on the modular connectors, and a plurality of ground pins shown generally at 130 formed in a row. The modular connectors 110 are further adapted to bus signals from an outside source to a substrate in the device to which the connector is mounted.

As can be seen in FIG. 3, a number of modular connectors 110 can be plugged into the first side 50 of PWB 30. The individual signal pins 120 and ground pins 130 will interface in the rows of plated-through-holes 60 and 70 respectively through first side 50 and onto second side 140 of PWB 30. The construction of typical modular connectors for use in the present invention are known in the art. Particularly, modular connectors which are useful in the present invention are described in commonly assigned U.S. Pat. No. 4,900,258, Hnatuck et al., the teachings of which are specifically incorporated herein by reference. Other connector modules which are particularly useful for interfacing with PWB 30 are described in commonly assigned U.S. Pat. Ser. No. 5,190,473, the teachings of which are also specifically incorporated herein by reference.

Figure 4:
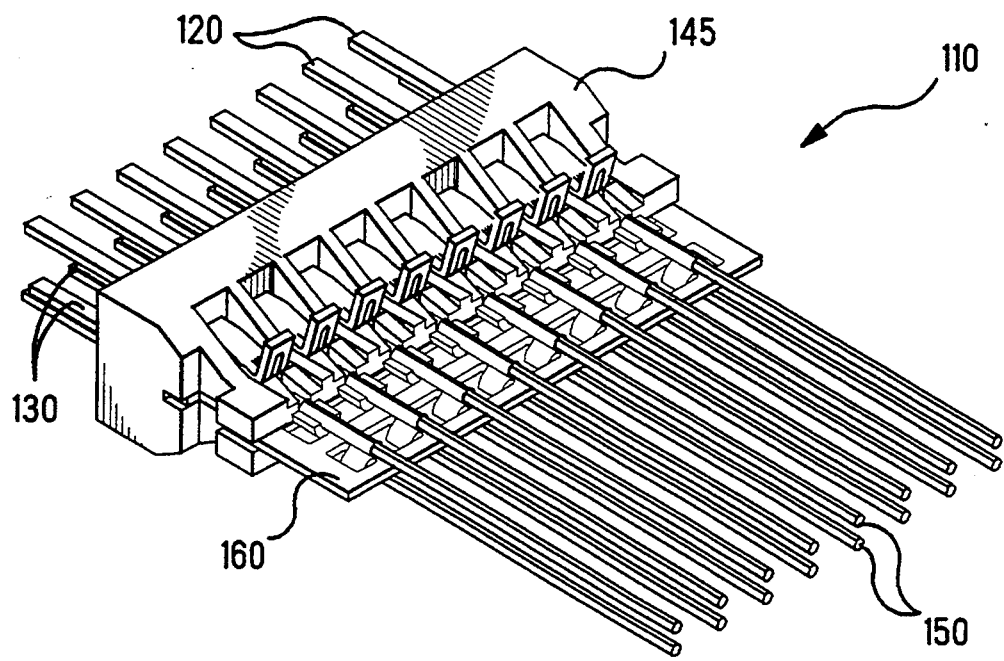
FIGS. 4 and 5 are illustrative of modular connectors interfaced with signal contact rows and ground contact rows on a printed wiring board.

Referring to FIG. 4, a preferred embodiment of modular connector 110 is illustrated. The modular connector 110 preferably comprises a housing 145 within which two rows of signal pins 120 and the row of ground pins 130 are secured. Preferably, the row of ground pins 130 is formed between the top and bottom rows of the signal pins 120. Microcoaxial wires 150 are preferably interfaced to a ground plate 160 which is further interfaced to the ground pins 130.

Figure 5:
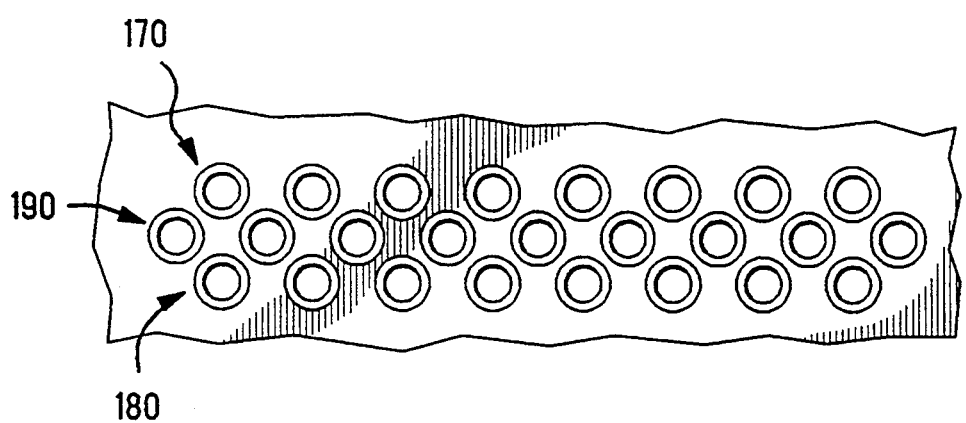

The individual pins in modular connectors 110 are interfaced with PWB 30 in the rows of plated-through-holes, a group of which is shown in more detail in FIG. 5. A first row of signal contacts comprising signal plated-through-holes is shown at 170. The top row of signal pins 120 is matable in the top row of signal plated-through-holes 170 (shown in FIG. 5). A second row of signal plated-through-holes is shown at 180 and is matable with the bottom row of signal pins 120. The center row of plated-through-holes 190 between rows 170 and 180 is preferably a row of ground plated-through-holes which are matable with the ground pins 130 on modular connector 110.

Figure 6:
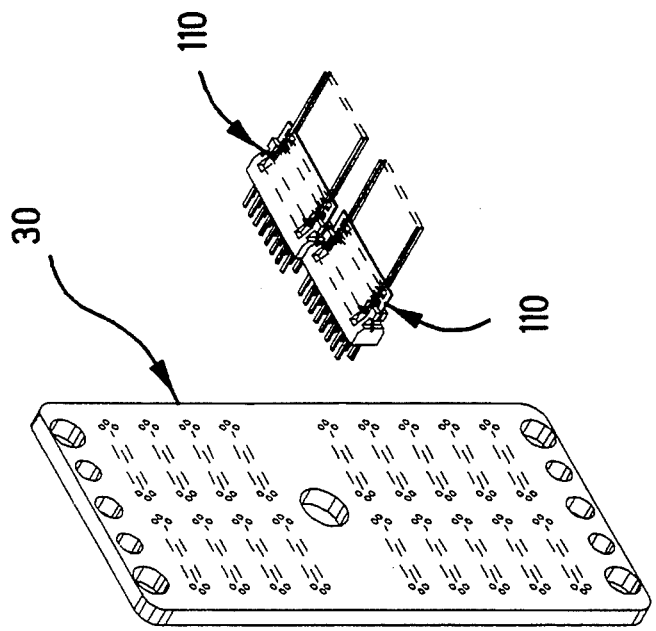
FIG. 6 is a schematic of a separable interface provided in accordance with the present invention.
Figure 6:
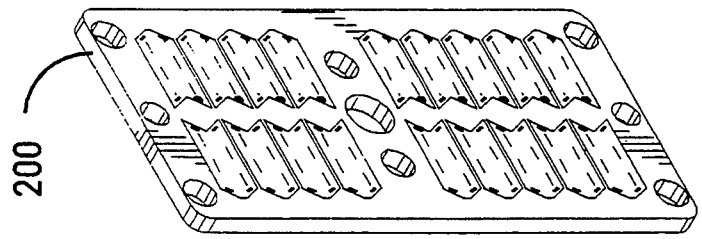
Figure 6:
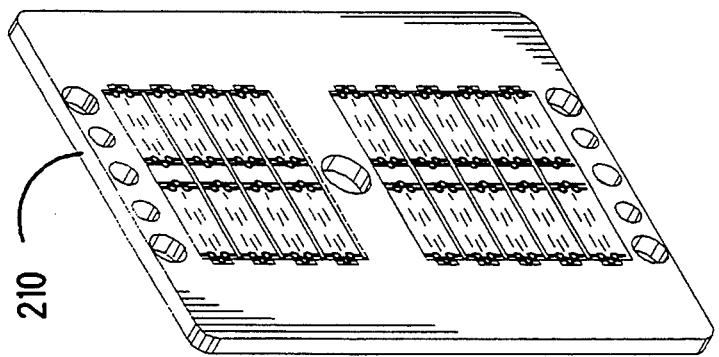
Figure 9:
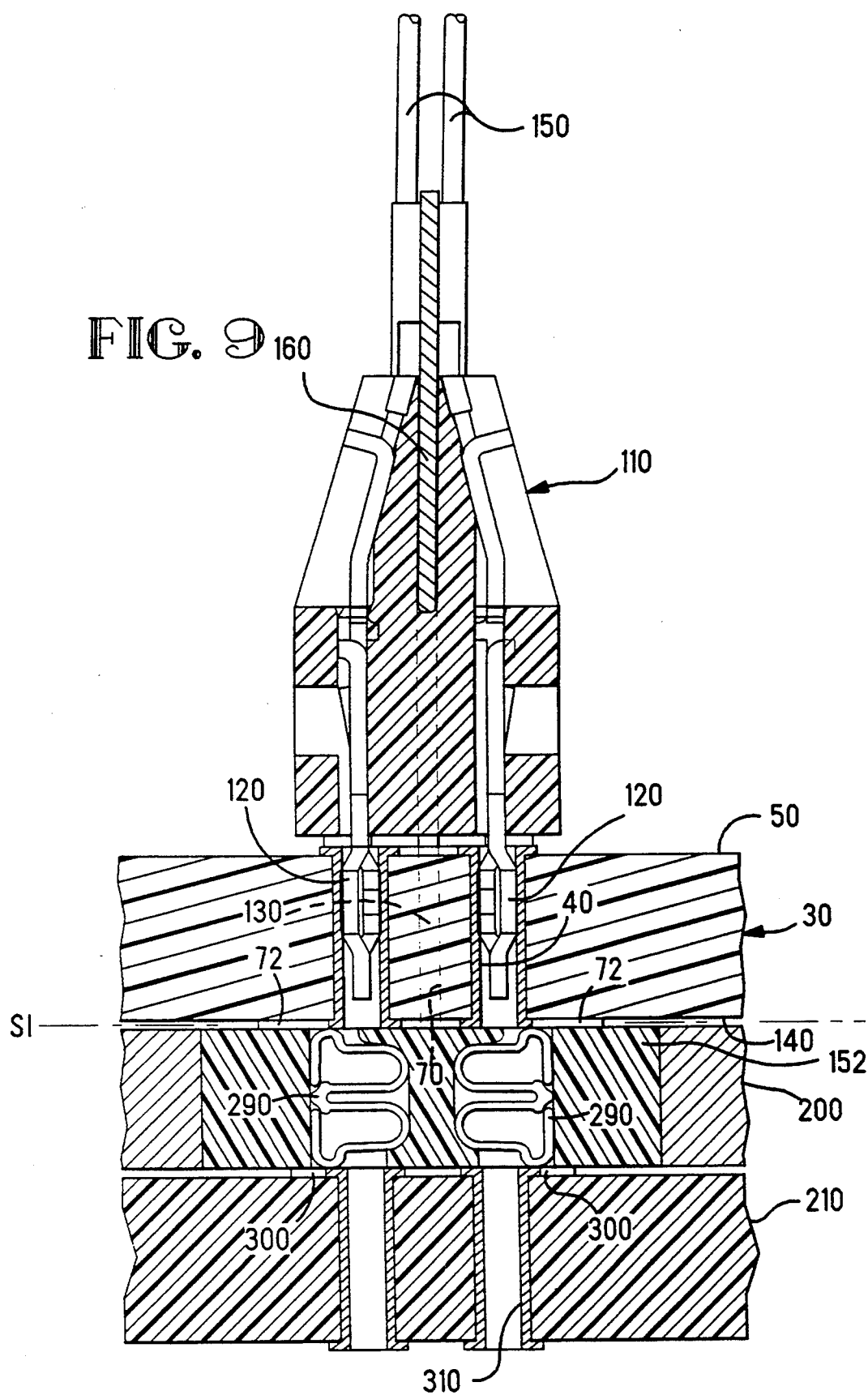
FIG. 9 is a diagrammatic representation of an assembly with which the present invention may be used.

Connectors provided in accordance with the present invention preferably form a "separable interface" with the substrate in the device. The separable interface is formed by implementing a high density land grid array. To develop this land grid array, an interposer shown at 200 in FIG. 6 is provided to the connector system to create the separable interface. In land grid array connector packaging provided in accordance with the present invention and shown in FIG. 9, the land grid array microelectronic devices such as the modular connectors 110 are interfaced at separable interface SI between PWB 30 and a substrate 210 secured in the device with the interposer contact nest 200 sandwiched therebetween. Interposer 200 is shown having contacts 290 disposed in respective cavities in a housing 152 and in electrical connection with plated through-holes 40 of PWB 30 and plated through-holes 310 of substrate 210 via spring-biased engagement with contact pads 70,300 thereof respectively when the assembly is completed such as by use of force generating mechanism 220 of FIG. 1. Connector 110 includes a plurality of contacts 120 terminated onto signal conductors of microcoaxial cables 150 and having contact sections inserted into through-holes 40 of PWB 30. Ground conductors of cables 150 are connected to a ground plate 160 having a plurality of contact sections 130 (FIG. 3) also inserted into plated through-holes 70 of PWB 30 (FIG. 3). Such an arrangement is shown in the publication "High-Density Zero Insertion Force Microcoaxial Cable Interconnection Technology", by Rothenberger and Mroczkowski, the inventors hereof (May 1992, AMP Incorporated, Harrisburg, Pa.). The substrate 210 in the device is preferably a second PWB which is a "motherboard" that contains data processing electronics. Interposers which are useful in accordance with the present invention are described in the above-referenced Grabbe et al. patents. One particularly useful interposer is also disclosed in U.S. Pat. No. 5,308,252.

As discussed above, the motherboard 210 is also preferably a PWB which is mated to the device and contains the particular electrical and electronic components which will process the data bussed through modular connectors 110 in PWB 30 from the outside source. Preferably, motherboard 210 is fixed in the device and the interposer nest 200 is registered to the motherboard 210 so that the contact pads in PWB 30 can be positioned to mate with contact elements in the interposer.

In operation of a connector which utilizes a separable interface in accordance with the present invention, PWB 30 is placed in contact with interposer nest 200 under zero force, and a force generating mechanism is then activated to complete the connection. The force generating mechanism is preferably a barrel 220, best shown in FIG. 1, which contains a bearing surface 230 that applies the force to PWB 30 to complete the connection in the separable interface. Any type of force generating mechanism is suitable to provide the required force to mate PWB 30 to interposer nest 200 which is interfaced to system PWB 210 and will vary according to the individual application requirements of connector 10.

Printed wiring boards in accordance with the present invention having plating artwork defining low signal-to-ground ratios ensure superlative electrical performance by minimizing the signal-to-ground ratios and customizing contact distribution on the printed wiring board through the plating pattern. In prior connectors utilizing printed wiring boards, the signal-to-ground ratios have been relatively high, usually greater than 5:1, since fewer ground contacts are made to the ground planes 80 as compared to the number of signal contacts in the signal plated-through-hole rows. In accordance with the present invention, the plating pattern 100 formed on the first side 50 of PWB 30 defines a signal-to-ground ratio of less than about 5:1. Preferably, the signal-to-ground ratio is about 2:1, and more preferably, is about 1:1 or less.

Figure 7:
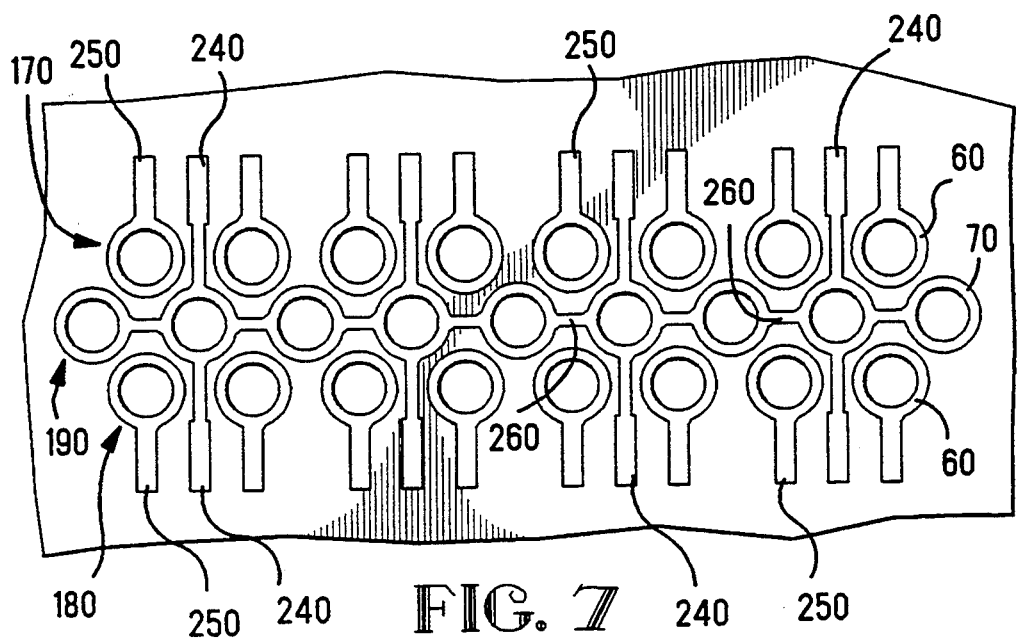
FIG. 7 is a schematic of a printed wiring board showing first and second signal rows of plated-through-holes and a ground row of plated-through-holes defining a signal-to-ground ratio for the printed wiring board of about 2:1.

A plating pattern in accordance with the present invention which establishes about a 2:1 signal-to-ground ratio is shown in FIG. 7. The ground plated-through-hole row 190 comprises ground plated-through-holes which are each individually provided with a ground contact interface 240 which will mate with the ground planes 80 (not shown in FIG. 7). The signal plated-through-holes each preferably comprise a signal contact interface 250 which mates with each of the signal plated-through-holes in the upper and lower rows 170 and 180 respectively. Additionally, the ground plated-through-holes in the center row 190 are interconnected to one another which eliminates the need to provide a ground contact 240 for alternate ground plated-through-holes. However, the reduction of this connection for each of the ground plated-through-holes increases the signal-to-ground ratio of the PWB having the plating pattern as substantially shown in FIG. 7.

To determine the signal-to-ground ratio provided by the plating pattern of FIG. 7, it is necessary to count the number of signal contacts 250 and divide this number by the number of ground contacts 240. Thus, it can be seen that the plating pattern in FIG. 7 has sixteen such signal contacts 250. Similarly, eight ground contacts 240 can be counted in the plating pattern of FIG. 7. Dividing 16 by 8, one obtains a signal-to-ground ratio of 2:1. This is a significant improvement in the signal-to-ground ratios as compared to prior printed wiring boards which are usually 5:1 or higher.

Figure 8:
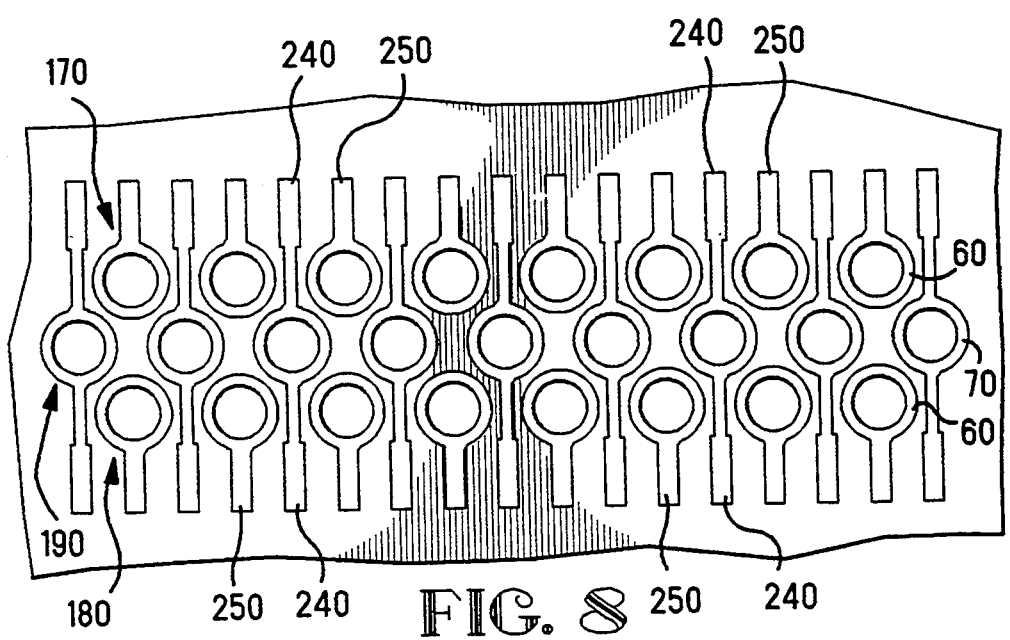
FIG. 8 is a schematic view of a portion of a printed wiring board having a plating pattern in accordance with the present invention which defines a signal-to-ground ratio for the printed wiring board of less than about 1:1.

Referring now to FIG. 8, a substantially optimum plating pattern produces a signal-to-ground ratio for the printed wiring board of less than about 1:1. It can be seen that eighteen ground contacts 240 exist in FIG. 8. Furthermore, there are sixteen signal contacts 250 produced by this particular plating pattern. Therefore, dividing 16 by 18, a signal-to-ground ratio of less than 1:1 can be calculated for the printed wiring board of FIG. 8. This is a highly advantageous signal-to-ground ratio, and ensures high electrical integrity and performance for the printed wiring board as electrical signals are bussed from the outside source to the motherboard in the device. Such results have not heretofore been achieved in the art.

Thus, by controlling the number of ground contacts 240 through the artwork developed by plating pattern 100, an optimally low signal-to-ground ratio of less than 1:1 is obtained for the PWB of FIG. 8. Simple variations in PWB artwork can provide variable signal-to-ground ratios which are constrained only by the modular connector ground plane contact geometries. The variable geometry, contact surface distribution in printed wiring boards provided in accordance with the present invention provides versatility to connector designers and the ability to maintain low signal-to-ground ratios with favorable impedance matching characteristics for connector systems for microwave or other high frequency applications. These results have not heretofore been achieved in the art, and allow for flexible connector design in an economical fashion.

There have thus been described certain preferred embodiments of printed wiring boards having low signal-to-ground ratios provided in accordance with the present invention. While preferred embodiments have been described and disclosed, it will be recognized by those with skill in the art that modifications are within the true spirit and scope of the invention. The appended claims are intended to cover all such modifications.

What is claimed is:

1. A printed wiring board for high performance signal transmission in a land grid array interconnection, comprising:
    a first side matable with a land grid array;
    a plurality of signal plated-through holes extending from the first side to a second side of the printed wiring board;
    a plurality of ground plated-through holes extending from the first side and onto the second side;
    a ground plane plated on the first side and in electrical communication with selected ones of the plurality of ground plated-through-holes and defining a signal-to-ground ratio for the printed wiring board; and
    plating material of said ground plane and said plurality of ground plated-through-holes on said first side being disposed between plating material joined to each one of said signal plated-through-holes, and plating material joined to at least all but five adjacent ones of said signal plated-through-holes,
    whereby a signal-to-ground ratio of less than about 5:1 is defined.

2. The printed wiring board recited in claim 1 wherein the signal plated-through-holes form at least a first row.

3. The printed wiring board recited in claim 2 wherein the signal plated-through-holes form first and second rows.

4. The printed wiring board recited in claim 3 wherein the ground plated-through-holes form a row disposed substantially between the first and second rows of the signal plated-through-holes.

5. The printed wiring board recited in claim 4 further comprising a plurality of ground contact pads interfaced with the ground plane and in electrical communication with selected ones of the plurality of ground plated-through-holes.

6. The printed wiring board recited in claim 5 further comprising plated interconnections between the plurality of ground plated-through-holes.

7. The printed wiring board recited in claim 6 wherein the signal-to-ground ratio is about 2:1.

8. The printed wiring board recited in claim 5 wherein the plurality of ground contacts is in electrical communication with each of the ground plated-through-holes.

9. The printed wiring board recited in claim 8 wherein the signal-to-ground ratio is less than about 1:1.

10. A printed wiring board for high performance signal transmission in a land grid array interconnection, and having a first and second side comprising:
    a first row of signal plated-through-holes adapted to receive a set of signal electrical pins from a connector module;
    a row of ground plated-through-holes adapted to receive a set of ground electrical interface pins from the connector module; and
    a plating pattern on the first side of the printed wiring board which defines a signal-to-ground ratio for the printed wiring board by interconnecting the row of ground plated-through-holes to ground areas on the first side, such that on said first side plating material of said plating pattern and said ground plated-through-holes is disposed between plating material joined to each one of said signal plated-through-holes, and plating material joined to at least all but five adjacent ones of said signal plated-through-holes,
    wherein the signal-to-ground ratio is less than about 5:1.

11. The printed wiring board recited in claim 10 wherein the plating pattern further comprises a plurality of ground contacts interfaced to selected ground plated-through-holes in the row of ground plated-through-holes.

12. The printed wiring board recited in claim 11 wherein the signal-to-ground ratio is about 2:1.

13. The printed wiring board recited in claim 12 further comprising a plurality of interconnections between each of the ground plated-through-holes such that the ground plated-through-holes are in electrical communication with alternate ground contacts.

14. The printed wiring board recited in claim 11 having a signal-to-ground ratio of less than about 1:1.

15. The printed wiring board recited in claim 14 wherein the plurality of ground contacts is interfaced with each of the ground plated-through-holes.

16. The printed wiring board recited in claim 15 wherein the ground areas are defined by at least one ground plane plated on the first side of the printed wiring board and in electrical communication with each of the ground contacts.

17. A connector having a separable interface for interconnection with a land grid array for high performance signal transmission, comprising:
    a connector module having a plurality of signal pins and a plurality of ground pins for bussing a signal from an outside source to a device that will utilize the signals; and
    a printed wiring board having a first side associated with a land grid array interconnection, and a second side associated with said connector module, and further comprising a first row of signal platedthrough-holes interfaced with the plurality of signal pins, a row of ground plated-through-holes interfaced with the plurality of ground pins, and a plating surface on the first side of the printed wiring board that has disposed thereon a plating pattern between the row of ground plated-through-holes; and plating material of said plating pattern and said plurality of ground plated-through-holes on said first side being disposed between plating material joined to each one of said signal plated-through-holes, and plating material joined to at least all but five adjacent ones of said signal plated-through-holes, thereby defining a signal-to-ground ratio for the printed wiring board of between about 1:1 and about 5:1.

18. The connector recited in claim 17 further comprising a plurality of ground contact pads interfaced with selected ground plated-through-holes in the row of ground plated-through-holes.

19. The connector recited in claim 18 wherein the ground contact pads are plated on the first side of the printed wiring board.

20. The connector recited in claim 19 wherein the plating surface further comprises at least one ground plane in electrical communication with the ground contacts.

21. The connector recited in claim 20 wherein the signal-to-ground ratio is about 2:1.

22. The connector recited in claim 21 further comprising plated interconnections between each of the ground plated-through-holes.

23. The connector recited in claim 20 wherein the signal-to-ground ratio is less than about 1:1.

24. The connector recited in claim 23 wherein the ground contacts are in electrical communication with each of the ground plated-through-holes in the row of ground plated-through-holes.

25. A method of establishing a signal-to-ground ratio for a printed wiring board useful in high performance signal transmission in a land grid array interconnection and having at least one row of signal plated-through-holes comprising the steps of:

providing a plurality of ground plated-through-holes to the printed wiring board interfaced through a first side of the printed wiring board onto a second side of the printed wiring board;

plating a ground plane on the first side of the printed wiring board with a substantially conductive material; and interconnecting the plated ground plane to selective ones of the ground plated-through-holes to establish a signal-to-ground ratio for the printed wiring board of between about 1:1 and about 5:1.

26. The method recited in claim 25 wherein the plating step further comprises the step of plating a plurality of ground contacts on the first side of the printed wiring board in electrical communication with selected ones of the plurality of ground plated-through-holes.

27. The method recited in claim 26 wherein the ground contacts are plated on the first side of the printed wiring board such that the ground contacts are in electrical communications with alternate ones of the plurality of the ground plated-through-holes.

28. The method recited in claim 27 further comprising the step of interconnecting the ground plated-through-holes together with the plating pattern.

29. The method recited in claim 28 wherein the signal-to-ground ratio is about 2:1.

30. The method recited in claim 26 wherein the ground contacts are placed in electrical communication with each of the plurality of the ground plated-through-holes.

31. The method recited in claim 30 wherein the signal-to-ground ratio is less than about 1:1.

* * * * *